US011978195B2

(12) United States Patent
Chiba et al.

(10) Patent No.: US 11,978,195 B2
(45) Date of Patent: May 7, 2024

(54) INSPECTION METHOD AND INSPECTION APPARATUS

(71) Applicant: Kioxia Corporation, Tokyo (JP)

(72) Inventors: Keisuke Chiba, Kawasaki Kanagawa (JP); Masato Naka, Yokohama Kanagawa (JP); Ryoji Yoshikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 262 days.

(21) Appl. No.: 17/346,669

(22) Filed: Jun. 14, 2021

(65) Prior Publication Data

US 2022/0230289 A1 Jul. 21, 2022

(30) Foreign Application Priority Data

Jan. 15, 2021 (JP) ................................ 2021-005206

(51) Int. Cl.
*G06K 9/00* (2022.01)
*G01N 23/2251* (2018.01)
(Continued)

(52) U.S. Cl.
CPC ......... *G06T 7/001* (2013.01); *G01N 23/2251* (2013.01); *G06T 5/50* (2013.01);
(Continued)

(58) Field of Classification Search
CPC ........... G01N 2201/10; G01N 23/2251; G01N 21/95607; G01N 21/8851;
(Continued)

(56) References Cited

U.S. PATENT DOCUMENTS 9,859,096 B2 1/2018 Ogasawara
10,281,415 B2 * 5/2019 Inoue .................... H01J 37/222
(Continued)

FOREIGN PATENT DOCUMENTS

JP 2017-83301 A 5/2017
JP 2017-151155 A 8/2017
(Continued)

*Primary Examiner* — Emily C Terrell
*Assistant Examiner* — Kevin M Coomber
(74) *Attorney, Agent, or Firm* — Finnegan, Henderson, Farabow, Garrett & Dunner, LLP

(57) ABSTRACT

There is provided an inspection method that includes determining, as a reference blur component, the magnitude of the blur component of a range, the range being a range where a number of first inspection images among the plurality of inspection images falling within the range is the largest among a plurality of ranges. The inspection method includes correcting, based on the reference blur component, a second inspection image among the plurality of inspection images having the magnitude of the blur component falling outside the range. The inspection method includes comparing the first inspection image and the corrected second inspection image with a reference image, the first inspection image having the magnitude of the blur component falling within the predetermined range, the reference image being generated in advance for the measurement object.

16 Claims, 6 Drawing Sheets

(51) Int. Cl.
*G06T 5/50* (2006.01)
*G06T 5/70* (2024.01)
*G06T 5/73* (2024.01)
*G06T 7/00* (2017.01)

(52) U.S. Cl.
CPC .................. *G06T 5/70* (2024.01); *G06T 5/73* (2024.01); *G01N 2223/6116* (2013.01); *G06T 2207/30148* (2013.01); *G06T 2207/30168* (2013.01)

(58) Field of Classification Search
CPC ............ G01N 2223/6116; H01J 37/244; H01J 37/28; H01J 2237/2817; H01J 37/22; G06T 7/0002; G06T 7/001; G06T 5/003; G06T 5/50; G06T 2207/30148; G06T 5/002; G06T 2207/30168
See application file for complete search history.

(56) References Cited

U.S. PATENT DOCUMENTS

2013/0343632 A1* 12/2013 Urano ..................... G06T 7/001 382/149
2019/0213726 A1* 7/2019 Hirano ............. G01N 21/95607
2019/0346769 A1* 11/2019 Hashimoto ............ G01B 15/04
2020/0286709 A1* 9/2020 Shiratsuchi ............. H01J 37/22
2020/0371337 A1* 11/2020 Dohi ......................... G06T 5/40
2021/0264587 A1* 8/2021 Kobayashi ................ G06T 7/44

FOREIGN PATENT DOCUMENTS

JP 2019-120654 A 7/2019
JP 2020-144010 A 9/2020

* cited by examiner

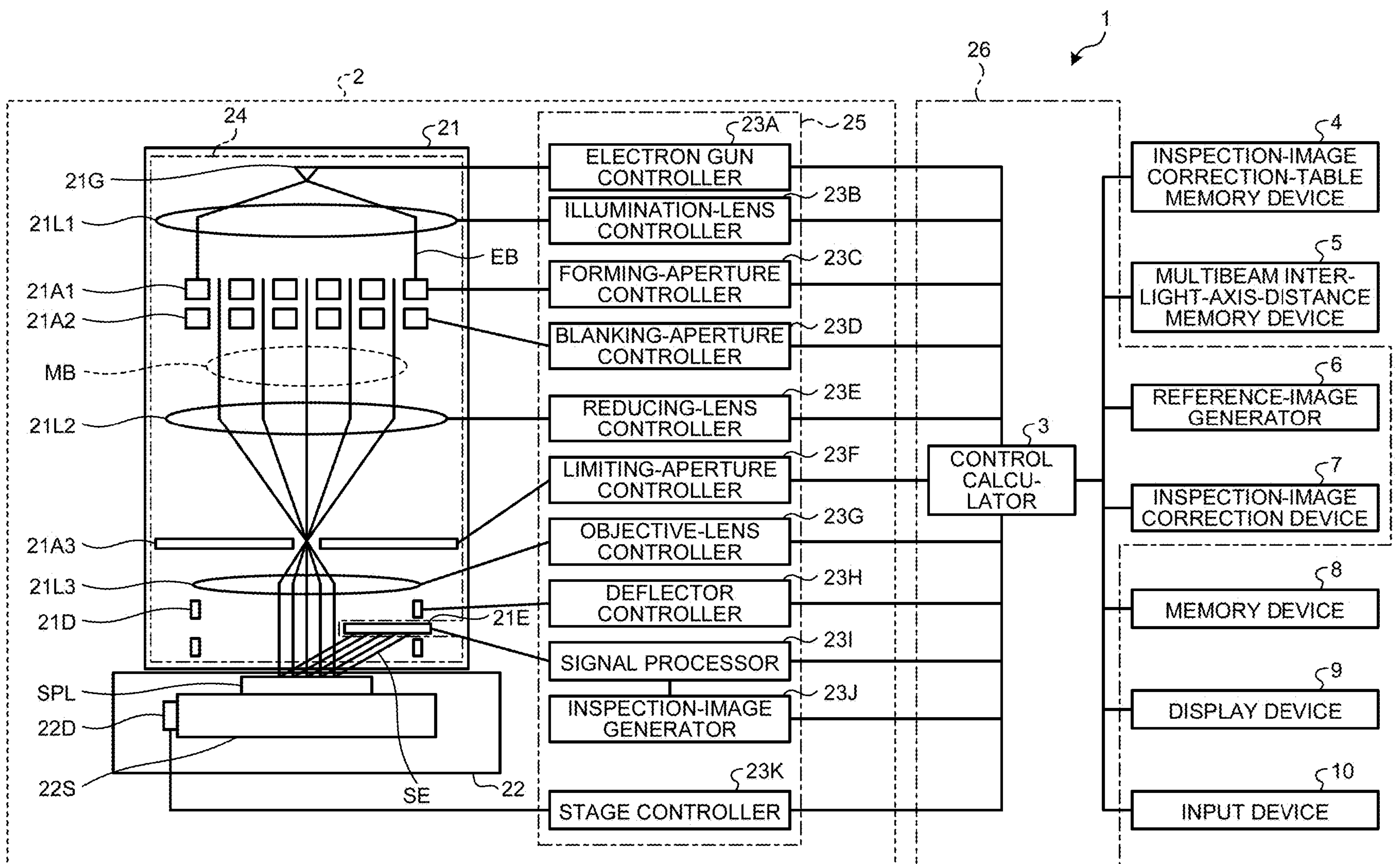
FIG.1
1
2
26
25
21
24
22
EB
SE
21E
21G
21L1
21A1
21A2
MB
21L2
21A3
21L3
21D
SPL
22D
22S
23A ELECTRON GUN CONTROLLER
23B ILLUMINATION-LENS CONTROLLER
23C FORMING-APERTURE CONTROLLER
23D BLANKING-APERTURE CONTROLLER
23E REDUCING-LENS CONTROLLER
23F LIMITING-APERTURE CONTROLLER
23G OBJECTIVE-LENS CONTROLLER
23H DEFLECTOR CONTROLLER
23I SIGNAL PROCESSOR
23J INSPECTION-IMAGE GENERATOR
23K STAGE CONTROLLER
3 CONTROL CALCU-LATOR
4 INSPECTION-IMAGE CORRECTION-TABLE MEMORY DEVICE
5 MULTIBEAM INTER-LIGHT-AXIS-DISTANCE MEMORY DEVICE
6 REFERENCE-IMAGE GENERATOR
7 INSPECTION-IMAGE CORRECTION DEVICE
8 MEMORY DEVICE
9 DISPLAY DEVICE
10 INPUT DEVICE

INSPECTION METHOD AND INSPECTION APPARATUS

CROSS-REFERENCE TO RELATED APPLICATIONS

This application is based upon and claims the benefit of priority from Japanese Patent Application No. 2021-005206, filed on Jan. 15, 2021; the entire contents of which are incorporated herein by reference.

FIELD

Embodiments described herein relate generally to an inspection method and an inspection apparatus.

BACKGROUND

For example, apparatuses which inspect masks and templates used in manufacturing of semiconductor devices include an apparatus that uses charged particles such as electron beams. Such an apparatus enables highly precise inspections since the apparatus has a high resolution power compared with, for example, an inspection apparatus which uses extreme ultraviolet light (EUV: Extreme Ultraviolet). On the other hand, for example, since the range that can be irradiated with an electron beam is extremely small, inspecting an entire surface of an inspection target takes time. Therefore, a multibeam inspection apparatus has been developed. An electron beam is divided by predetermined apertures to generate a multibeam, and an inspection target is irradiated with the multibeam.

In a case in which a multibeam is used, single beams constituting the multibeam are affected by different aberrations depending on the transmission position (distance from the center) at an objective lens. Therefore, in each inspection image captured by each single beam, a different image blur, distortion, or tone error is generated. Depending on the blur of the image, a matter which is not a defect may be determined as a defect (false defect).

BRIEF DESCRIPTION OF THE DRAWINGS

FIG. 1 is a block diagram illustrating an example of a multibeam inspection apparatus according to an embodiment;

DETAILED DESCRIPTION

Figure 2A:
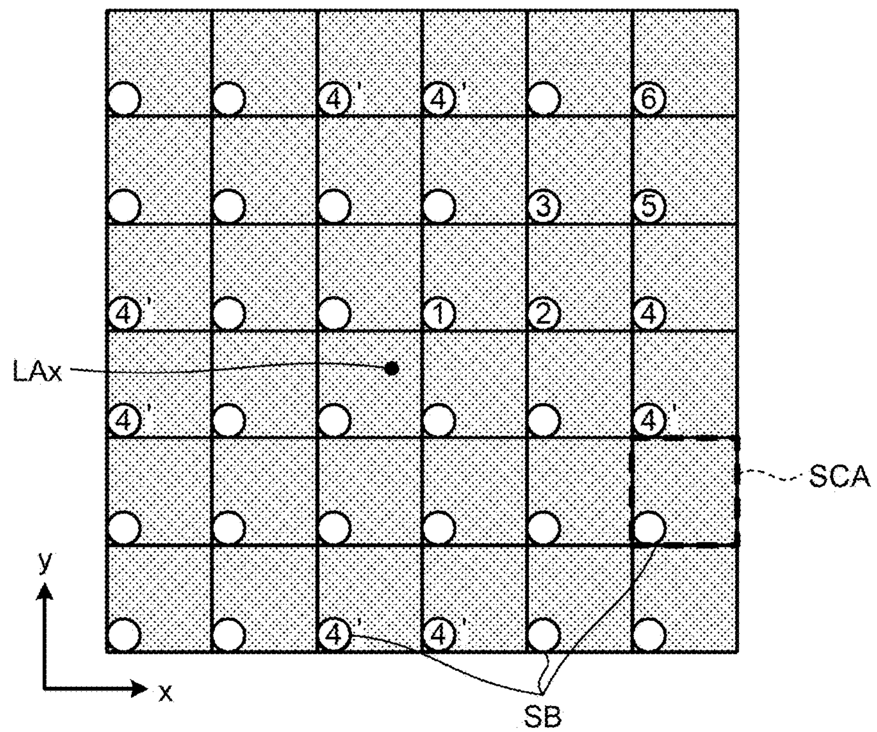
FIG. 2A is a diagram illustrating a disposition example of single beams constituting a multibeam.

In general, according to one embodiment, there is provided an inspection method that includes irradiating a measurement object with a plurality of single beams. The inspection method includes generating a plurality of inspection images of the measurement object corresponding to the plurality of single beams. The inspection method includes calculating magnitudes of blur components of the plurality of respective inspection images. The inspection method includes determining, as a reference blur component, the magnitude of the blur component of a predetermined range, the predetermined range being a range where a number of first inspection images among the plurality of inspection images falling within the predetermined range is the largest among a plurality of ranges. The inspection method includes correcting, based on the reference blur component, a second inspection image among the plurality of inspection images having the magnitude of the blur component falling outside the predetermined range. The inspection method includes comparing the first inspection image and the corrected second inspection image with a reference image, the first inspection image having the magnitude of the blur component falling within the predetermined range, the reference image being generated in advance for the measurement object.

Exemplary embodiments of the present invention will be explained below with reference to the accompanying drawings. The present invention is not limited to the following embodiments. In all of the accompanying drawings, the same or corresponding members or parts are denoted by the same or corresponding reference signs, and redundant descriptions thereof are omitted. Also, the drawings are not for illustrating the relative ratios among members or parts or among the thicknesses of various layers. Therefore, specific thicknesses and dimensions may be determined by those skilled in the art in view of the following non-limitative embodiments.

FIG. 1 is a block diagram illustrating an example of a multibeam inspection apparatus 1 according to an embodiment. As illustrated in FIG. 1, the multibeam inspection apparatus 1 according to the present embodiment is provided with an inspection mechanism 2, a control calculator 3, an inspection-image correction-table memory device 4, a multibeam inter-light-axis-distance memory device 5, a reference-image generator 6, an inspection-image correction device 7, a memory device 8, a display device 9, and an input device 10. The control calculator 3 is connected to the inspection mechanism 2, the inspection-image correction-table memory device 4, the multibeam inter-light-axis-distance memory device 5, the reference-image generator 6, the inspection-image correction device 7, the memory device 8, the display device 9, and the input device 10.

The inspection mechanism 2 includes an electronic lens barrel 21, a sample chamber 22, an electron gun controller 23A, an illumination-lens controller 23B, a forming-aperture controller 23C, a blanking-aperture controller 23D, a reducing-lens controller 23E, a limiting-aperture controller 23F, an objective-lens controller 23G, a deflector controller 23H, a signal processor 231, an inspection-image generator 23J, and a stage controller 23K.

The electronic lens barrel 21 is provided with an electron gun 21G, an illumination lens 21L1, forming apertures 21A1, blanking apertures 21A2, a reducing lens 21L2, a limiting aperture 21A3, an objective lens 21L3, a deflector 21D, and a detector 21E. Also, a stage 22S, which is movable at least in XYZ-directions, and a drive mechanism 22D of the stage are provided in the sample chamber 22. The interior of the sample chamber 22 is configured so that pressure can be reduced by a vacuum device (not illustrated).

Note that a structure including the electron gun 21G, the illumination lens 21L1, the forming apertures 21A1, the blanking apertures 21A2, the reducing lens 21L2, the limiting aperture 21A3, the objective lens 21L3, and the deflector 21D functions as an optical system 24, which irradiates a sample with a plurality of single beams. Also, a structure including the electron gun controller (electron-gun control circuit) 23A, the illumination-lens controller (illumination-lens control circuit) 23B, the forming-aperture controller (forming-aperture control circuit) 23C, the blanking-aperture controller (blanking-aperture control circuit) 23D, the reducing-lens controller (reducing-lens control circuit) 23E, the limiting-aperture controller (limiting-aperture control circuit) 23F, the objective-lens controller (objective-lens control circuit) 23G, the deflector controller (deflector control circuit) 23H, the signal processor (signal processing circuit) 231, the inspection-image generator (inspection-image generating circuit) 23J, and the stage controller (stage control circuit) 23K functions as a control circuit 25, which controls the optical system 24, the detector 21E, and the stage 22.

The control calculator 3 is connected also to the electron gun controller 23A, the illumination-lens controller 23B, the forming-aperture controller 23C, the blanking-aperture controller 23D, the reducing-lens controller 23E, the limiting-aperture controller 23F, the objective-lens controller 23G, the deflector controller 23H, the signal processor 231, the inspection-image generator 23J, and the stage controller 23K. The control calculator 3 generates various control signals and sends the signals to the electron gun controller 23A, the illumination-lens controller 23B, the forming-aperture controller 23C, the blanking-aperture controller 23D, the reducing-lens controller 23E, the limiting-aperture controller 23F, the objective-lens controller 23G, the deflector controller 23H, the signal processor 231, the inspection-image generator 23J, and the stage controller 23K.

Note that the control calculator 3 may be composed as, for example, a computer including a central processing unit (CPU), a ROM, and a RAM. Also, the control calculator 3 can be realized also by hardware such as an application-specific integrated circuit (ASIC), programmable gate array (PGA), and a field-programmable gate array (FPGA). The control calculator 3 can control the entire multibeam inspection apparatus 1 and carry out various arithmetic processing in accordance with predetermined programs and various data. The programs and data may be stored in the memory device 8 and downloaded to the control calculator 3 therefrom. Also, the programs and various data may be downloaded to the control calculator 3 from a non-temporary computer-readable storage medium such as a hard disk drive (HDD), a semiconductor memory, or a server by wire or wireless.

The electron gun controller 23A is connected to the electron gun 21G in the electronic lens barrel 21 and controls the electron gun 21G based on the control signals from the control calculator 3. A predetermined electron-gun power source (not illustrated) is connected to the electron gun 21G, an acceleration voltage is applied between a cathode and an anode of the electron gun 21G from a high-voltage circuit of the electron-gun power source under control of the electron gun controller 23A, and a heating voltage is applied to the cathode from a heating circuit of the electron-gun power source. As a result, electrons released by heating of the cathode are accelerated by the acceleration voltage, and an electron beam is formed. In more detail, the electron-gun power source is controlled by the electron gun controller 23A, and ON/OFF, an electron beam amount, electron beam energy, etc. of the electron beam are adjusted.

The illumination-lens controller 23B is connected to the illumination lens 21L1 and controls the illumination lens 21L1 based on the control signals from the control calculator 3. Under control of the illumination-lens controller 23B, the illumination lens 21L1 forms the electron beam from the electron gun 21G into a parallel beam which can enter the forming apertures 21A1 in a subsequent stage approximately perpendicularly thereto and irradiates the entire forming apertures 21A1 with the formed electron beam.

The forming-aperture controller 23C is connected to the forming apertures 21A1 and controls the forming apertures 21A1 based on the control signals from the control calculator 3. The forming apertures 21A1 have a plurality of rectangular holes and generate a multibeam MB, which includes a plurality of single beams, by allowing the electron beams, which have been radiated to the forming apertures 21A1, to transmit through the plurality of rectangular holes.

The blanking-aperture controller 23D is connected to the blanking apertures 21A2 and controls the blanking apertures 21A2 based on the control signals from the control calculator 3. Under the control of the blanking-aperture controller 23D, the blanking aperture 21A2 individually deflects each of the single beams of the multibeam MB generated by the forming aperture 21A1.

The reducing-lens controller 23E is connected to the reducing lens 21L2 and controls the reducing lens 21L2 based on the control signals from the control calculator 3. The reducing lens 21L2 reduces each of the single beams, which have passed through the blanking apertures 21A2, and changes the directions of the single beams so that the single beams are directed toward the center of the limiting aperture 21A3.

The limiting-aperture controller 23F is connected to the limiting aperture 21A3 and controls the limiting aperture 21A3 based on the control signals from the control calculator 3. The limiting aperture 21A3 has a hole at the center thereof and allows the single beams, which have not been deflected by the blanking apertures 21A2, to transmit through the hole. On the other hand, the limiting aperture 21A3 blocks the single beams which have been deflected by the blanking apertures 21A2.

The objective-lens controller 23G is connected to the objective lens 21L3 and controls the objective lens 21L3 based on the control signals from the control calculator 3. The objective lens 21L3 adjusts a focal point of each of the single beams, which have passed through the hole at the center of the limiting aperture 21A3, to a surface of a sample S (inspection target) on the stage 22S.

The detector 21E is disposed at a position shifted from the light axis which reaches the surface of the sample S from the electron gun 21G, wherein the position is in a vicinity of the stage 22.

The deflector controller 23H is connected to the deflector 21D and controls the deflector 21D based on the control signals from the control calculator 3. Specifically, the deflector 21D deflects, toward the detector 21E, charged particles (for example, secondary electrons) SE generated by each of the single beams, which have entered the surface of the sample S. The detector 21E has a plurality of detection units arranged in a two dimensional manner on a surface (lower surface in FIG. 1) to which the secondary electrons SE are to enter. The number of the detection units corresponds to the number of the single beams, which have entered the surface of the sample S. The number of the detection units may be equal to the number of the single beams, which have entered the surface of the sample S, or may be an integral multiple of the number of the single beams. The charged particles (for example, secondary electrons SE) generated by each of the single beams enter each of the detection units, and the detection unit generates a detection signal based on the entered charged particles SE. Note that the plurality of detection units at the detector 21E can be considered as a plurality of pixel groups. The detection units at the detector 21E may correspond to pixel groups. Each of the pixel groups may further include a plurality of pixels which are two dimensionally arranged.

The signal processor 231 is connected to the detector 21E, receives the detection signals (plurality of pixel signals) of the plurality of detection units from the detector 21E, and carries out predetermined signal processing with respect to the plurality of received pixel signals. The signal processor 231 processes the plurality of pixel signals, associates the processed pixel signals with two-dimensional positions, and supplies the signals to the inspection-image generator 23J.

The inspection-image generator 23J is connected to the signal processor 231 and receives the signals processed by the signal processor 231. The inspection-image generator 23J generates image signals of an image (inspection image) of a pattern formed on the surface of the sample S based on the plurality of received pixel signals. The inspection-image generator 23J constitutes the plurality of pixel signals as two-dimensional image signals in accordance with the two-dimensional positions of the pixels and generates the image signals of the inspection image. The image signals of the inspection image are displayed as an inspection image by the display device 9 via the control calculator 3 and are stored in the memory device 8.

The stage controller 23K is connected to the drive mechanism 22D in the sample chamber and controls the drive mechanism 22D based on the control signals from the control calculator 3. The drive mechanism 22D can drive the stage 22S under control of the stage controller 23K. The stage 22S can be moved in the x-direction, the y-direction, and the z-direction and is driven by the drive mechanism 22D, which is controlled by the stage controller 23K. As a result, the single beams are subjected to scanning with respect to the sample S placed on the stage 22S.

The input device 10 is an interface having, for example, a keyboard, a touch screen, or a computer mouse. Information such as the distance from the light axis of each single beam of the multibeam, an inspection-image correction table, electron beam conditions, types of inspection target patterns, a coordinate position of an inspection area, and various threshold values for inspection can be input to the control calculator 3 by the input device 10.

The memory device 8 stores information such as the electron beam conditions, the types of inspection target patterns, the coordinate position of the inspection area, and the various threshold values for inspection, which have been input from the input device 10. The memory device 8 also stores a reference image and inspection results together with the image (inspection image) of the pattern formed on the surface of the sample S.

The inspection-image correction-table memory device 4 stores the inspection-image correction table, which has been generated or input. The multibeam inter-light-axis-distance memory device 5 stores the distance from the light axis of each multibeam.

The reference-image generator 6 generates reference images by a predetermined method. For example, in a case of a Die-to-database inspection, the reference-image generator 6 generates a reference image corresponding to an inspection image acquired from drawing data or exposure image data (design data) of a pattern, which is stored in the memory device 8 and to be formed on the sample S, by the single beams. The exposure image data is the data of an image created by predicting the contrasting density corresponding to the emissivity of the secondary electrons when each layout pattern is tested by the multibeam inspection apparatus 1 in accordance with layout design data and the information of materials of each layout pattern. Also, for example, in a case of a Die-to-die inspection, the reference-image generator 6 generates a reference image by averaging a plurality of inspection images acquired from the parts of a plurality of same shape patterns on the sample S. The generated reference images are stored in the memory device 8.

The inspection-image correction device 7 carries out blur correction of the inspection image based on the inspection-image correction table stored in the inspection-image correction-table memory device 4 and generates a corrected inspection image. The generated inspection image after the blur correction is stored in the memory device 8.

Note that a structure including the control calculator 3, the reference-image generator 6, and the inspection-image correction device 7 functions as a controller 26, which controls the control circuit 25.

Figure 2B:
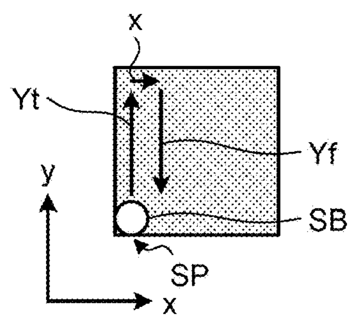
FIG. 2B is a diagram illustrating a scanning example of the single beam.
Figure 2C:
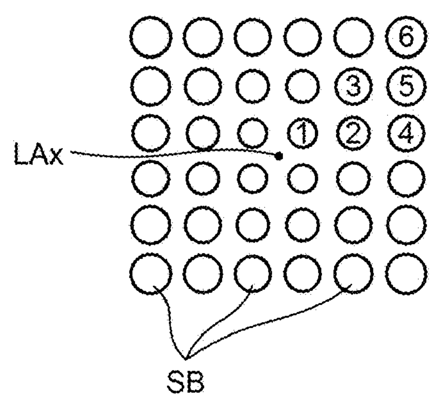
FIG. 2C is a diagram illustrating an example of blurs of the single beams.
Figure 3:
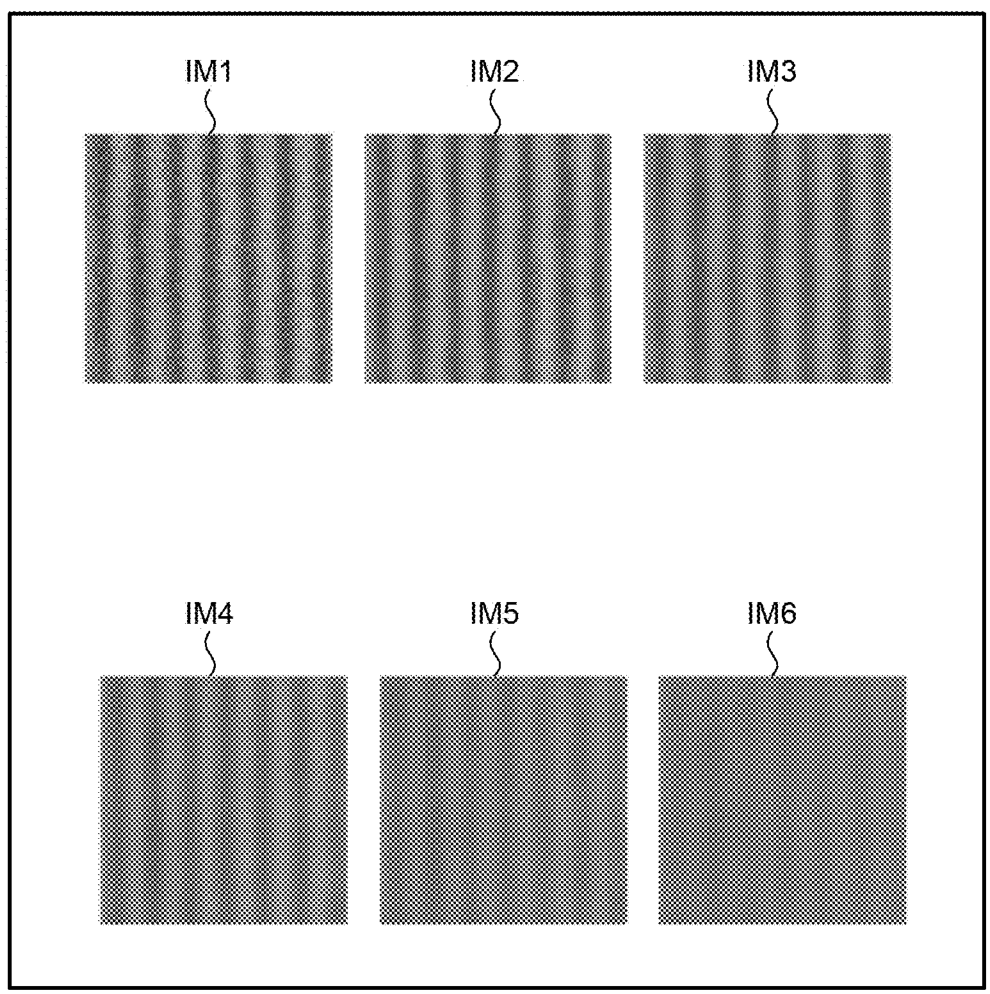
FIG. 3 is a diagram illustrating examples of blurs of inspection images acquired for respective single beams.

Next, the plurality of single beams SB radiated to the sample S will be described. FIG. 2A is a diagram illustrating a disposition example of the single beams SB constituting the multibeam MB, FIG. 2B is a diagram illustrating a scanning example of the single beam, and FIG. 2C is a diagram illustrating an example of blurs of the single beams. Also, FIG. 3 is a diagram illustrating examples of blurs of inspection images acquired for respective single beams.

With reference to FIG. 2A, a plurality of scan target regions SCA is set like a lattice on the surface of the sample S. The single beams SB are allocated to correspond to the scan target regions SCA. In other words, the number of the scan target regions SCA may be equal to the number of the single beams SB. In the illustrated example, 36 scan target regions SCA are set like a lattice to correspond to 36 single beams. Note that the number of the single beams SB (in other words, the number of the scan target regions SCA) is not limited to that of the illustrated example, but may be $n^2$ (n is a natural number). Note that the number of the detection units of the detector 21E (see FIG. 1) may be equal to the number of the scan target regions SCA or may be an integral multiple of the number of the scan target regions SCA.

As illustrated in FIG. 2B, the single beam SB is subjected to scanning by the stage 22S (FIG. 1) like an arrow Yt along the y-direction from a scanning start point SP in the corresponding scan target region SCA. When the single beam SB reaches an end in the y-direction of the scan target region SCA, the single beam moves like an arrow X by a predetermined distance so as not to overlap with the previous movement track, and the single beam is subjected to scanning in the y-direction like an arrow Yf. Thereafter, this process is repeated, and the entire scan target region SCA is scanned by the single beam. While the single beam SB carries out scanning, the secondary electrons SE (FIG. 1) are released from the surface of the sample S. The secondary electrons SE are detected by the detection unit of the detector 21E corresponding to the scan target region SCA. An inspection image is generated based on the position of the single beam SB and the detection amount of the secondary electrons SE at the position.

Herein, the single beams SB have different blurs depending on the distances from a light axis LAx as illustrated in FIG. 2C. In this diagram, the circles indicates the single beams SB, and the sizes of the circles schematically illustrate the sizes of the blurs. More specifically, for example, compared with the single beam SB illustrated with a number "1" in the circle, the single beams SB illustrated with "2" to "6" are illustrated by large circles. Therefore, these single beams SB have larger blurs than the single beam SB of "1". For example, the more distant the single beam SB is from the light axis LAx, the larger the blur thereof. Such blurs are generated since the larger the distance of the single beam SB from the light axis LAx, the larger the influence of off-axis aberrations. Also, a blur is generated when the focal point of the single beam SB is positioned above or positioned below the surface of the sample S. Furthermore, the single beam SB is formed by flying of a plurality of charged particles (in this example, electrons), and a blur is also generated when a beam is widened due to Coulomb repulsion force that works between the charged particles.

When such a blur is generated in the single beam SB, a blur is generated also in the inspection image generated in accordance with the single beam. FIG. 3 illustrates the inspection images illustrating examples thereof, wherein stripe structures formed on the sample S are illustrated. For example, an inspection image IM1 in FIG. 3 illustrates the inspection image of the single beam SB represented by "1" in FIG. 2A, an inspection image IM2 illustrates the inspection image of the single beam SB represented by "2", an inspection image IM3 illustrates the inspection image of the single beam SB represented by "3", an inspection image IM4 illustrates the inspection image of the single beam SB represented by "4", an inspection image IM5 illustrates the inspection image of the single beam SB represented by "5", and an inspection image IM6 illustrates the inspection image of the single beam SB represented by "6". As illustrated, in the inspection image IM1 of the single beam SB of "1" having a comparatively small blur, stripes can be clearly observed. In comparison, in the inspection image of the single beam SB of "6" having a large blur, boundaries of stripes (more specifically, lines and spaces) are unclear. Moreover, such unclearness becomes notable from the single beam SB of "2" to the single beam SB of "6", in other words, as the blurs of the single beams SB become large. This is conceivably for a reason that the larger the blur of the single beam SB, the lower the resolution power of the inspection image.

Figure 4:
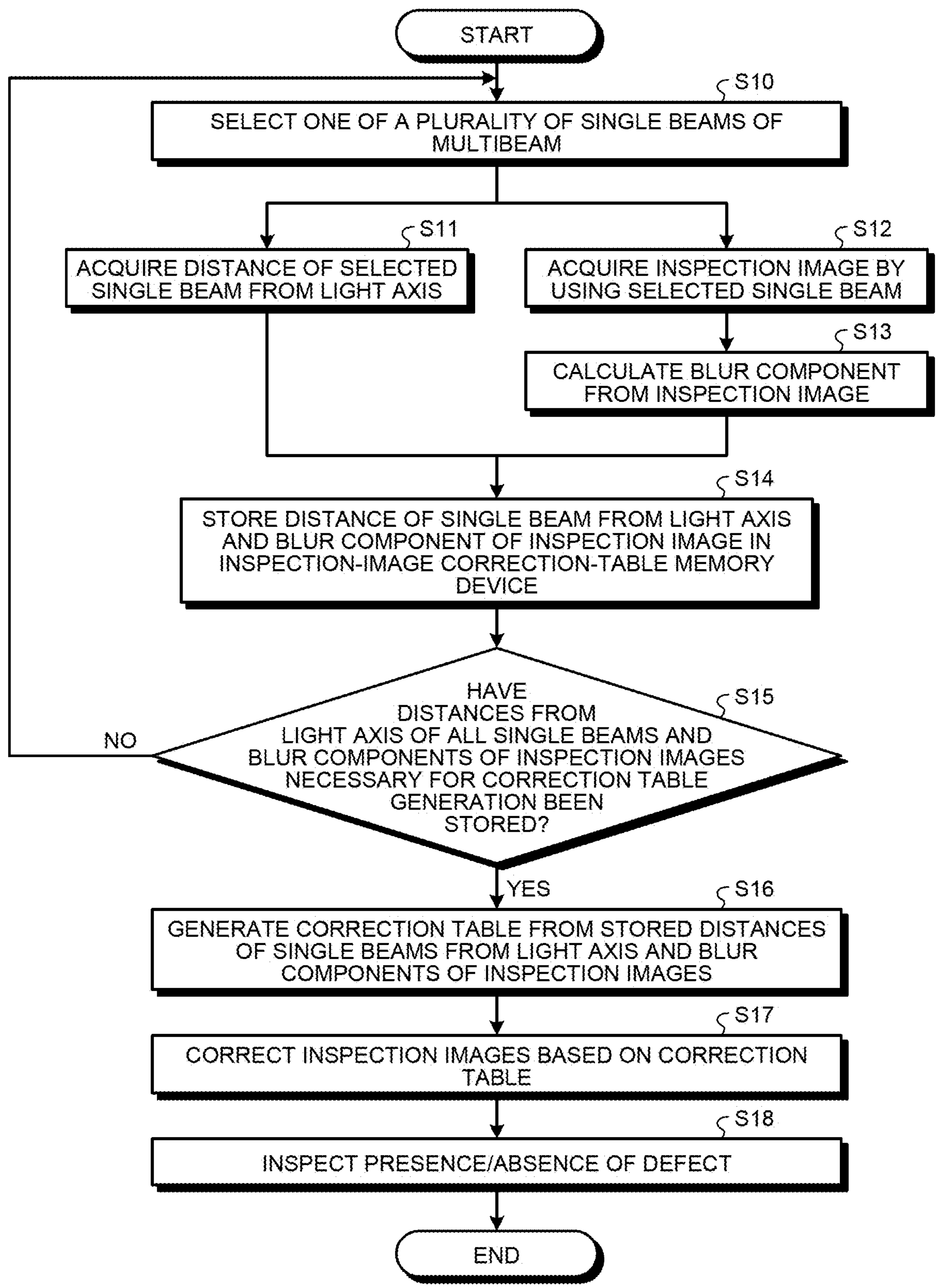
FIG. 4 is a flow chart describing an inspection method according to the present embodiment.

Hereinafter, an inspection method according to the present embodiment will be described with reference to FIG. 4. The inspection method according to the present embodiment can be carried out by the multibeam inspection apparatus 1 of FIG. 1. FIG. 4 is a flow chart describing the inspection method according to the present embodiment. First, in step S10, one of the plurality (36 in the example of FIG. 2) of single beams SB of the multibeam MB radiated to the sample S is selected. The sample S may be, for example, a mask or a template.

Then, in step S11, the distance between the selected single beam SB and the light axis LAx is acquired. For example, the distance can be calculated by using an intersecting point of the sample S and the light axis LAx as an origin point and obtaining the position of the focal point of the selected single beam SB. Herein, the position of the focal point may be expressed by, for example, an orthogonal coordinate system (x, y, z) or a cylindrical coordinate system (r, θ, z). In a case of the orthogonal coordinate system, an x-coordinate and a y-coordinate may be coordinates on an xy-plane using the position of the light axis LAx as the origin point. In a case of the cylindrical coordinate system, an r-coordinate may be the distance from the light axis LAx, which serves as the origin point on the xy-plane, and a θ coordinate may be the intersecting point of a line segment, which connects the origin point and the coordinate point, and the x-axis. In a case of any of the coordinate systems, a z-coordinate may be the distance in the z-direction between a z-direction reference position and the focal point of the beam. The z-direction reference position may be the height of a flat part of the sample, may be the position of an average height of irregularities of the sample, or may be a z-direction position of the intersecting point of the light axis and the sample.

Note that, as mentioned above, since the single beam SB is subjected to scanning in the scan target region SCA, the position of the focal point is different depending on the position thereof in the scan target region SCA. Therefore, for example, the position of the focal point with respect to the origin point (light axis LAx) may be obtained, for example, if the single beam SB is at the scanning start point SP in the scanning start point SP in the scan target region SCA or at the center thereof. Also, the coordinates ((x, y), (r, θ)) in the xy-plane may be the coordinates of the position of the focal point of the single beam SB or a predetermined position (for example, the scanning start point SP or the center) in the scan target region SCA. Note that the distances of the single beams SB from the light axis LAx are not continuous values, but are discrete values since each single beam SB is allocated to each scan target region SCA. Specifically, in the example of FIG. 2A, the distances of the single beams SB from the light axis LAx are six distances of the single beams SB represented by "1" to "6". More specifically, in the example of this diagram, the seven single beams SB represented by "4'" have approximately the same distance as the distance of the single beam SB of "4" from the light axis LAx.

The focal point position of the beam of the single beam SB is determined, for example, by the optical system of the multibeam inspection apparatus 1 and is sometimes above or below the sample surface. If the distance of each beam is already known, the value thereof can be used as the z-direction coordinate. Also, since the sample surface has irregularities, the difference between a reference of the z-direction position and the height of the sample surface at the position subjected to radiation by the single beam SB may be used as the z-coordinates. The blurs of the single beam SB are not only generated in the xy-plane due to aberrations, etc., but also are determined by height differences of the focal point positions, irregularities of the sample surface, etc. Therefore, by taking the z-coordinate into consideration, the distance between the light axis and the beam and the amount to be corrected can be also found out in detail. The acquired distance is stored in the multibeam inter-light-axis-distance memory device 5.

Also, in step S12, an inspection image is acquired by the selected single beam SB. More specifically, the selected single beam SB is subjected to scanning in the corresponding scan target region SCA, the secondary electrons SE released by the scanning are detected by the corresponding detection unit in the detector 22E, and the inspection image is generated.

Subsequently, in step S13, a blur component in the generated inspection image is calculated. The inspection images IM1 to IM6 illustrated in FIG. 3 illustrate, for example, stripe structures formed on the sample S. Herein, for example, along the direction orthogonal to the longitudinal direction of the stripes, changes in the intensity (or brightness) of the signals generated by the detector can be plotted and subjected to fitting by a normal distribution (Gaussian distribution). Then, the blur component can be defined by the fitting parameter (for example, peak value or full width at half maximum). Also, the blur component may be defined by a difference from the generated reference image based on design data on which the observed structure is based. Furthermore, the blur component may be defined by the difference from the clearest (least blurred) inspection image, for example, the inspection image IM1.

Then, in step S14, the distance of the single beam SB from the light axis LAx acquired in step S12 and the blur component calculated in step S13 are associated and stored in the inspection-image correction-table memory device 4.

In next step S15, whether the distances from the light axis LAx and the blur components have been stored in the inspection-image correction-table memory device 4 or not for all the plurality of single beams SB is determined. If not all of the distances and the blur components have not been stored (step S15: NO), the process returns to step S10, another single beam SB is selected from the remaining single beams SB, and the process from step Sll to S13 is carried out. If the distances and the blur components have been stored for all the single beams SB (step S15: YES), a correction table is generated in step S16. This correction table may be stored in the inspection-image correction-table memory device 4.

Subsequently, in step S17, the inspection images are corrected based on the correction table. An example of the correction is as follows. First, the number of the inspection images having equivalent degrees of blur components is checked. In order to do this, for example, the magnitudes of the blur components are sorted into a plurality of sections (or classes) of predetermined ranges, and degrees of the sections are obtained. In other words, a histogram of the blur components may be created. Herein, the blur component defined by the section having the largest degree (the section, wherein the number of the inspection images having the blur component of the section is the largest) is determined as a reference blur component. In other words, the magnitudes of the blur components of the plurality of inspection images are sectioned by predetermined sections, and the degrees of the sections are obtained. In this case, the reference blur component may be the blur component which is the representative value of the section (predetermined range) having the largest degree.

Note that a specific value of the reference blur component may be a median value, a minimum value, or a maximum value of the largest-degree section. Also, an average value of the blur components of the inspection images belonging to the section may be used as the reference blur component magnitude. Furthermore, a value within the range of the largest-degree section (range that is equal to or higher than the minimum value and equal to or lower than the maximum value of the section) may be set as the reference blur component.

Then, the inspection images are corrected so that almost all of the inspection images generated respectively by the single beams SB have the reference blur component. For example, if it is assumed that the blur component of the inspection image IM3 in FIG. 3 is equal to the reference blur component, correction is carried out so that the inspection images IM1, IM2, and IM4 to IM6 have the blur component equal to the reference blur component. In other words, regarding the inspection image IM1 having the blur component smaller than the blur component of the inspection image IM3, correction of increasing the blur component is carried out. Specifically, the value of the normal-distribution fitting parameter of the inspection image IM1 can be set to the value of the normal-distribution fitting parameter of the inspection image IM3. Also, regarding the inspection image IM6 having the blur component larger than the blur component of the inspection image IM3, correction of reducing the blur component is carried out. Also in this case, the value of the normal-distribution fitting parameter of the inspection image IM6 can be set to the value of the normal-distribution fitting parameter of the inspection image IM3. As a result, all of the inspection images IM1 to IM6 have blurs which are equivalent to that of the inspection image IM3. In this manner, the inspection images are corrected.

After all of the inspection images generated respectively by the single beams SB are corrected, presence/absence of defects, etc. about the sample S is inspected regarding the inspection images of the inspection target in step S18. More specifically, the inspection images that have the blur components within the predetermined range (including the inspection image having the blur component equal to the reference blur component) is compared with the reference image, which has been generated by the reference-image generator 6 and stored in the memory device 8. Also, the corrected inspection images (including the inspection image having the blur component equal to the reference blur component) are compared with the reference image, which has been generated by the reference-image generator 6 and stored in the memory device 8. For example, pixel values of a plurality of respective pixels constituting the inspection image of the inspection target are compared with pixel values of the pixels at the corresponding positions among a plurality of pixels constituting the reference image. As a result of the comparison, for example if a difference equal to or more than a threshold value is observed at an arbitrary pixel position, the position in the sample S (see FIG. 2A) corresponding to the non-inspection region SCA including the pixel at which the difference has been observed is specified, and presence of a defect or the like at the position of the non-inspection region SCA is detected. Also, if the non-inspection region SCA corresponds to a plurality of pixels, the pixel position including the defect in the non-inspection region SCA may be further specified, and presence of a defect or the like at the position corresponding to the pixel position in the non-inspection region SCA of the sample S may be detected.

Note that the comparison between the inspection image and the reference image may be carried out between each of the inspection images and the reference image corresponding to the inspection image. In other words, the inspection may be carried out for each of the scan target regions SCA. Also, some of all of the plurality of inspection images may be synthesized, and the synthesized inspection image and the reference image corresponding thereto may be compared with each other. According to this, the inspection can be carried out for each die (or chip).

As described above, in the inspection method according to the present embodiment, the blur component with which the number of the inspection images having the equivalent blur component is the largest is obtained among the inspection images generated by the plurality of single beams SB constituting the multibeam MB, and correction is carried out so that all the inspection images have that blur component. Therefore, for example, compared with a case in which correction is carried out to adjust to a minimum blur component or a maximum blur component, less inspection images are required as correction targets. Also, compared with a case in which correction is carried out to adjust to the minimum blur component, the degree of correction of the maximum blur component can be reduced. On the contrary, compared with a case in which correction is carried out to adjust to the maximum blur component, the degree of correction of the minimum blur component can be reduced. Therefore, according to the inspection method of the present embodiment, the inspection images can be quickly corrected while avoiding increase in processing load.

MODIFICATION EXAMPLE

Figure 5:
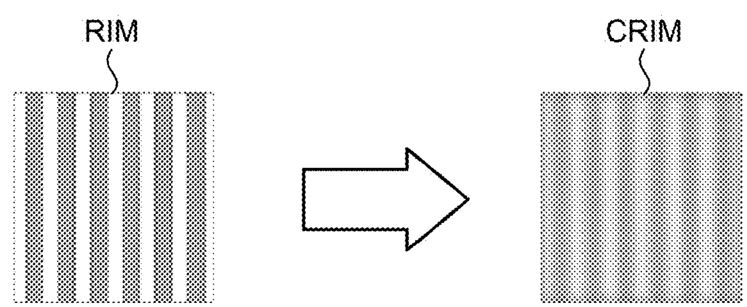
FIG. 5 is a schematic diagram illustrating an example of applying a blur component to a reference image.

Next, a modification example of the inspection method according to the present embodiment will be described. In this modification example, reference images are corrected. As mentioned above, for example in a case of a Die-to-database inspection, reference images are generated by the reference-image generator 6 based on drawing data or exposure image data (design data) of a pattern to be formed on the sample S stored in the memory device 8. When the reference image is generated based on the design data in this manner, the difference thereof from the inspection image (including corrected image) may become excessively large. In such a case, a blur of the inspection image (for example, a blur at the boundary of the stripes illustrated in FIG. 3) may be recognized as a defect. In order to avoid this, as illustrated in FIG. 5, a blur component may be applied to a reference image RIM generated by the reference-image generator 6, and a corrected reference image CRIM is acquired.

Figure 6:
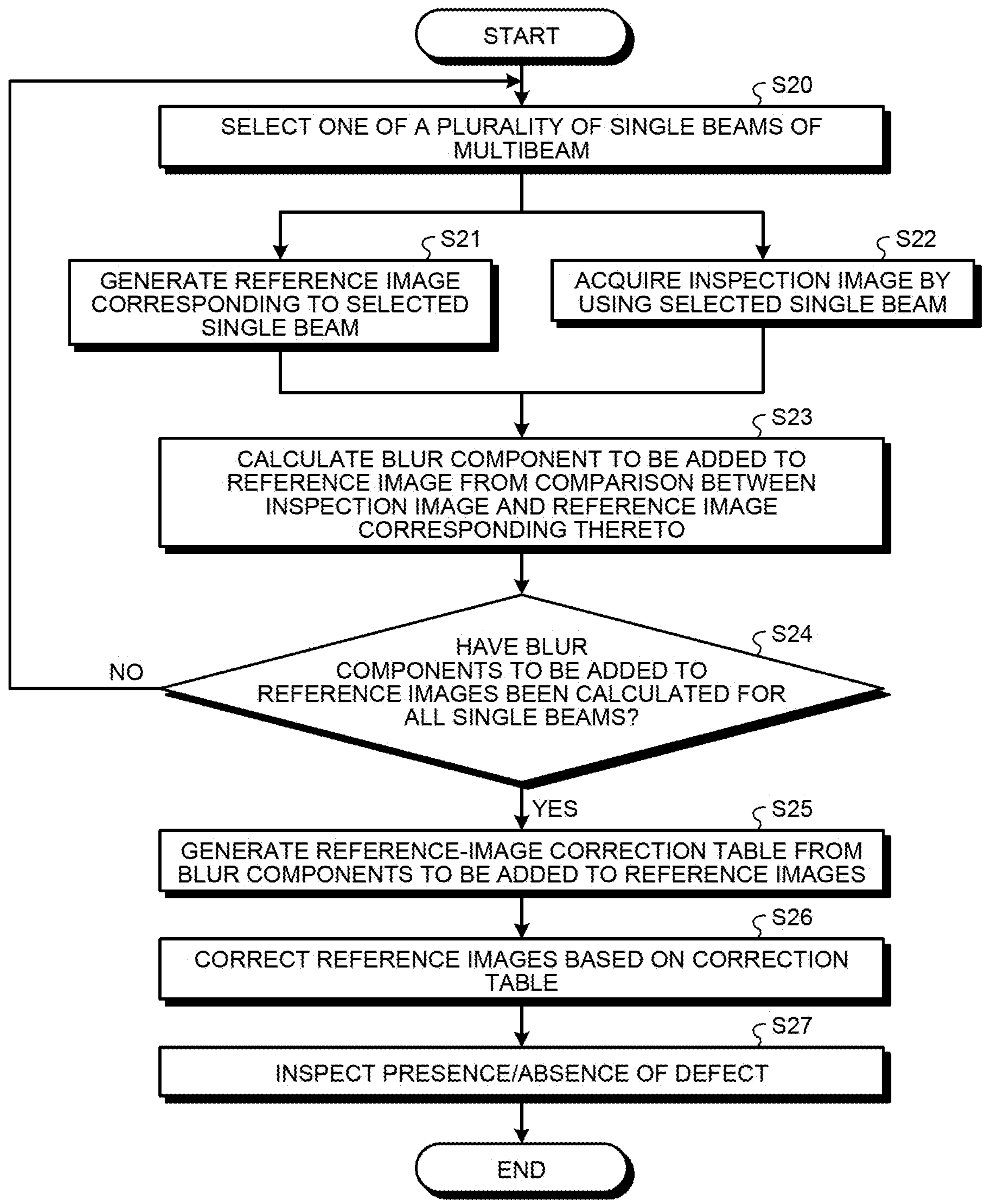
FIG. 6 is a flow chart illustrating a procedure of correcting a reference image.

Hereinafter, with reference to FIG. 6, a procedure of correcting reference images will be described. FIG. 6 is a flow chart illustrating the procedure of correcting reference images. First, in step S20, one of the plurality of single beams SB of the multibeam MB radiated to the sample S is selected. Then, in step S21, a reference image is generated by the reference-image generator 6 for the scan target region SCA, which is to be scanned by the selected single beam SB. Note that this reference image may be generated in advance and stored in the memory device 8, and, in such a case, the reference image may be read from the memory device 8 in step S21. Also, in step S22, an inspection image is acquired by the selected single beam SB.

Then, in step S23, the inspection image obtained by the selected single beam SB and the reference image corresponding thereto are compared with each other, thereby calculating a blur component to be applied to the reference image. The inspection image obtained by the selected single beam SB may be an inspection image having a blur component which is within a predetermined range. Then, in step S24, whether the inspection image and the blur component to be applied to the reference image thereof have been calculated or not is determined for all the single beams SB. If it is determined that they have not been calculated (step S24: No), the process returns to step S20, and steps S20 to S23 are carried out. If it is determined that they have been calculated (step S24: Yes), the process proceeds to step S25, a reference-image correction table is generated by the reference-image generator 6 from the calculated blur components, which are to be applied to the reference images, and is stored in the memory device 8.

Subsequently, based on the reference-image correction table stored in the memory device 8, the reference images are corrected (step S26). Then, each inspection image and the corrected reference image CRIM corresponding thereto are compared with each other, and presence/absence of defects, etc. of the sample S is inspected (step S27).

According to the inspection method of this modification example, as above, the possibility that a blur of the inspection image (for example, blur of the boundary of stripes illustrated in FIG. 3) is recognized as a defect can be reduced. By virtue of this, false defects can be reduced. Also, as a matter of course, no defects, etc. are present in the reference image RIM generated based on the design data. Therefore, even when the blur component is applied to the reference image RIM, defects, etc. in the inspection image can be reliably found out.

OTHER MODIFICATION EXAMPLES

In the embodiment as above, the corrected inspection image and the reference image are compared with each other. However, the reference image can be also corrected by using the blur component used to correct the inspection image in this process. More specifically, for example, a reference image may be corrected so that the reference image generated from design data has a predetermined blur component (including the above described reference blur component), and the corrected reference image and the corrected inspection image may be compared with each other. According to this, if a difference is observed as a result of the comparison, the position at which the difference is observed is specified, and presence of a defect or the like at the position is detected.

Also, in the embodiment as above, regarding all the single beams SB, the distances of the single beams SB from the light axis LAx and the blur components of the inspection images are obtained (steps S11, S12). However, if the magnitudes of the blur component can be estimated in advance, already obtained blur components may be used instead. For example, if there is a correlation between the distance and the blur component, the blur component of the inspection image of one single beam SB can be conceived to be equal to the blur component of the image of another single beam SB, which is at a distance equal to the distance of the single beam SB. For example, in FIG. 2A, since it is conceivable that the blur component of the inspection image generated by the single beam SB of "4'" is approximately equal to the blur component of the inspection image generated by the single beam SB of "4", the blur component may be considered to have the same blur component as the blur component of the inspection image of the single beam SB of "4" without calculation.

Also, in the embodiment as above, the reference blur component is set by checking the number of the inspection images having an equivalent degree of blur components. However, if there is a correlation between the distance of the single beam SB from the light axis LAx and the blur component, the reference blur component may be set based on the single beam SB at which the number of the single beams SB having an approximately equal distance from the light axis LAx is the largest. In other words, the distances of the plurality of single beams SB from the light axis LAx are sectioned by predetermined sections, and the degree of each section is obtained; in this case, the reference blur component may be the blur component of the inspection image of the single beam SB of the section having the largest degree. In other words, the reference blur component may be the blur component corresponding to a representative value of the section (predetermined distance range) having the largest degree. In the example of FIG. 2A, for example, while the number of the single beams SB at the same distance as the single beam SB of "3" is four, the number of the single beams SB at the same distance as the single beams SB of "4" is eight. Therefore, the blur component of the inspection image of the single beam SB of "4" may be set as the reference blur component.

Also, the inspection method according to the present embodiment may be carried out for each inspection of a sample S (inspection object), or the inspection method may be carried out by a predetermined number of times if samples S of the same type is to be repeatedly inspected. Also, the inspection method according to the present embodiment may be carried out every time an inspection of a sample S of a different type is carried out.

Also, the sample S does not have to be the inspection object per se, but may be a sample prepared in advance for calibration, and the inspection-image correction table may be generated by using this.

Also, in the embodiment as above, the inspection-image correction table is created from the distances from the light axis LAx of the multibeam MB and the blur components of the generated inspection images, but is not limited thereto. The inspection-image correction table may be created in advance, may be stored for example in the memory device 8, and may be read from the memory device 8 in a case of an inspection. Also, the inspection-image correction table created in advance may also be stored in a memory device provided outside the multibeam inspection apparatus 1 and subjected to input and use therefrom.

Also, in the embodiment as above, the electron beam from the electron gun 21G is divided into the plurality of single beams SB. However, the embodiment is not limited to use electron beams, but also can use other charged particles. Examples of the charged particles include ions. In such a case, an ion generator is used instead of the electron gun 21G, and an optical system can be provided to suit division, convergence, and scanning of ion beams. The inspection method according to the present embodiment can be carried out also by such an apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the embodiment as above, the inspection-image correction table is created from the distances of the light axis of the multibeam and the blur components of the obtained inspection images. However, the present invention is not limited thereto. The inspection-image correction table may be stored in the memory device in advance and read from the memory device in a case of an inspection. Also, the table may be input from outside the pattern multibeam inspection apparatus in every inspection.

What is claimed is:

1. An inspection method comprising:

irradiating a measurement object with a plurality of single beams;

generating a plurality of inspection images of the measurement object corresponding to the plurality of single beams;

calculating magnitudes of blur components of the plurality of respective inspection images;

associating the magnitudes of the blur components of the plurality of respective inspection images with distances between a single beam and a light axis, the single beam being each of the plurality of single beams, the single beam having been used to generate an inspection image having a blur component, the distances between the single beam and the light axis being three-dimensional distances each including a distance in a height direction between a reference position and a focal point of the single beam, the height direction being a direction along with the light axis;

determining, as a reference blur component, the magnitude of the blur component of a range, the range being a range where a number of first inspection images among the plurality of inspection images falling within the range is the largest among a plurality of ranges;

correcting, based on the reference blur component, a second inspection image among the plurality of inspection images having the magnitude of the blur component falling outside the range; and comparing the first inspection image and the corrected second inspection image with a reference image, the first inspection image having the magnitude of the blur component falling within the range, the reference image being generated in advance for the measurement object, wherein the correcting includes correcting the second inspection image so that the second inspection image has the reference blur component, and reducing the blur component of the second inspection image depending on a degree of the blur component of the second inspection image, the degree being higher than the reference blur component.

2. The inspection method according to claim 1, wherein the determining includes, when the number of the inspection images having the magnitude of the blur component falling within the range is equal to the number of the inspection images for which the distance falls within a distance range, determining, as the reference blur component, the blur component associated with the inspection image for which the distance falls within the distance range.

3. The inspection method according to claim 1, wherein the correcting includes correcting the second inspection image so that the magnitude of the blur component of the second inspection image falls within the range.

4. The inspection method according to claim 1, wherein the reference blur component is a representative value of the range.

5. The inspection method according to claim 1, wherein the inspection method further includes generating the reference image based on design data of a pattern to be formed on the measurement object.

6. The inspection method according to claim 1, wherein the inspection method further includes generating the reference image by averaging a plurality of inspection images corresponding to a same pattern.

7. The inspection method according to claim 1, wherein the inspection method further includes applying a blur component to the reference image based on the blur component of the inspection image.

8. The inspection method according to claim 7, wherein the applying the blur component includes comparing the first inspection image with the reference image, the first inspection image having the magnitude of the blur component falling within the range, and calculating the blur component to be applied to the reference image.

9. The inspection method according to claim 1, wherein the irradiating includes generating the plurality of single beams by dividing a single beam.

10. The inspection method according to claim 1, wherein the comparing includes comparing a pixel value of each of a plurality of pixels constituting the first inspection image or the corrected second inspection image with a pixel value of a pixel at a corresponding position among a plurality of pixels constituting the reference image, the first inspection image having the magnitude of the blur component falling within the range.

11. The inspection method according to claim 10, wherein the inspection method further includes specifying a position having a difference in the pixel values equal to or higher than a threshold value between the first inspection image or the corrected second inspection image and the reference image, the first inspection image having the magnitude of the blur component of the measurement object falling within the range.

12. An inspection apparatus comprising:

an optical system;

a control circuit that controls the optical system; and a controller that controls the control circuit, wherein the optical system irradiates a measurement object with a plurality of single beams, the control circuit controls the optical system and has an image generating circuit that generates a plurality of inspection images of the measurement object corresponding to the plurality of single beams, the controller controls the control circuit and configured to:

calculate magnitudes of blur components of the plurality of respective inspection images;

associate the magnitudes of the blur components of the plurality of respective inspection images with distances between a single beam and a light axis, the single beam being each of the plurality of single beams, the single beam having been used to generate an inspection image having a blur component, the distances between the single beam and the light axis being three-dimensional distances each including a distance in a height direction between a reference position and a focal point of the single beam, the height direction being a direction along with the light axis;

determine, as a reference blur component, the magnitude of the blur component of a range, the range being a range where a number of first inspection images among the plurality of inspection images falling within the range is the largest among a plurality of ranges;

correct, based on the reference blur component, a second inspection image among the plurality of inspection images having the magnitude of the blur component falling outside the range, by correcting the second inspection image so that the second inspection image has the reference blur component, and by reducing the blur component of the second inspection image depending on a degree of the blur component of the second inspection image, the degree being higher than the reference blur component; and compare the first inspection image and the corrected second inspection image with a reference image, the first inspection image having the magnitude of the blur component falling within the range, the reference image being generated in advance for the measurement object.

13. The inspection apparatus according to claim 12, further comprising:

a stage on which the measurement object is placed; and a detector disposed in a vicinity of the stage, wherein the control circuit further controls the stage and the detector.

14. The inspection apparatus according to claim 13, wherein the detector has a plurality of detection units corresponding to the plurality of single beams, and the plurality of inspection images correspond to detection signals of the plurality of detection units.

15. The inspection apparatus according to claim 12, wherein when the number of the first inspection images having the magnitude of the blur component falling within the range is substantially equal to the number of the inspection image for which the distance falls within a distance range, the controller determines, as the reference blur component, the blur component associated with the inspection image for which the distance falls within the distance range.

16. The inspection apparatus according to claim 12, wherein the controller applies a blur component to the reference image based on the blur component of the inspection image.

* * * * *